United States Patent
Kuan et al.

(10) Patent No.: US 6,943,099 B2
(45) Date of Patent: Sep. 13, 2005

(54) METHOD FOR MANUFACTURING GATE STRUCTURE WITH SIDES OF ITS METAL LAYER PARTIALLY REMOVED

(75) Inventors: Shih-Fan Kuan, Taoyuan (TW); Kuo-Chien Wu, Miaoli (TW)

(73) Assignee: NANYA Technology Corporation, Taoyuan (TW)

( * ) Notice: Subject to any disclaimer, the term of this patent is extended or adjusted under 35 U.S.C. 154(b) by 0 days.

(21) Appl. No.: 10/768,070

(22) Filed: Feb. 2, 2004

(65) Prior Publication Data

US 2005/0170624 A1    Aug. 4, 2005

(51) Int. Cl.[7] ................. H01L 21/3205; H01L 21/4763
(52) U.S. Cl. ...................... 438/592; 438/238; 438/381
(58) Field of Search .......................... 438/592, 152, 438/153, 155, 199, 200, 197, 201, 238, 311, 438/381, 584, 585

(56) References Cited

U.S. PATENT DOCUMENTS

| 5,610,089 A | * | 3/1997 | Iwai et al. ................. 438/210 |
| 6,284,633 B1 | * | 9/2001 | Nagabushnam et al. .... 438/585 |
| 6,524,898 B2 | * | 2/2003 | Nagaya ..................... 438/155 |

* cited by examiner

Primary Examiner—David Nhu
(74) Attorney, Agent, or Firm—Bacon & Thomas, PLLC

(57) ABSTRACT

A method for manufacturing a gate structure has the steps of providing a substrate; forming a conducting layer on the substrate; forming a metal layer on the conducting layer; forming a patterned first protective layer on the metal layer, the protective layer having a side surface; partially removing the side surface of the first protective layer to form a first gate element having a first gate pattern; transferring the first gate pattern to the metal layer to form a second gate element; conformally forming a second protective layer on the first gate element, the second gate element and the conducting layer, causing a second gate pattern; and transferring the second gate pattern to the conducting layer to form a third gate element.

10 Claims, 3 Drawing Sheets

US 6,943,099 B2

METHOD FOR MANUFACTURING GATE STRUCTURE WITH SIDES OF ITS METAL LAYER PARTIALLY REMOVED

BACKGROUND OF THE INVENTION

1. Field of the Invention

The present invention relates to a process for manufacturing a semiconductor memory, more specifically, to a method for manufacturing a gate structure of a semiconductor memory.

2. Description of the Prior Art

In the traditional process for manufacturing a semiconductor memory, a contact structure is usually formed by a contact hole to make necessary electrical connection between relative parts. As shown in FIG. 1, a bit contact structure formed by a DRAM semiconductor memory process mainly comprises a substrate 11 usually formed of silicon, a conducting layer 12 usually formed of poly-silicon, a metal layer 13 usually formed of WSi, a protective layer 14 usually formed of SiN, an insulating layer 15, which is referred to a spacer in general and usually formed of silicon nitride, a barrier layer 16 usually formed of silicon nitride, an insulating layer 17 usually formed of BPSG, an insulating layer 18 usually formed of TEOS, and a metal layer 19 mainly consisting of W and TiN/Ti. In this structure, the conducting layer 12, metal layer 13 and protective layer 14 compose gates. The metal layer 19, which is generally referred to an M0 metal layer, is formed as a bit line, and is also filled into a bit contact hole to form a bit line contact.

However, in the process of forming the bit line contact hole, the shoulder portions of the protective layer 14 and insulating layer 15 of the gate are usually damaged to expose the metal layer 13, since the etching time is very long. Accordingly, an improper short circuit between the metal layers 13 and 19 occur. One of the improving methods is to partially remove a portion of the sides of the gate metal layer 13 to avoid the undesired contact with the metal layer 19, as shown in FIG. 1.

The method mentioned above may solve the short circuit problem, however, since the side of the gate metal layer 13 is partially removed, the insulating layer 15 and barrier layer 16 may indent inward, causing a void 171 formed between the gates when the insulating layer 17 is formed, as shown in FIG. 1. Accordingly, the insulation property is degraded, and the electrical performance of the whole structure is influenced. Therefore, a solution for overcoming this problem is necessary.

SUMMARY OF THE INVENTION

An objective of the present invention is to provide a method for manufacturing gate structure, which can avoid improper short circuit between a bit line metal layer and a gate metal layer without voids generated in an insulating layer between the gates, so that the insulating property and the electrical performance of the whole structure can be well maintained.

According to an aspect of the present invention, the method for manufacturing gate structure comprises steps of providing a substrate; forming a conducting layer on the substrate; forming a metal layer on the conducting layer; forming a patterned first protective layer on the metal layer, the protective layer having a side surface; partially removing the side surface of the first protective layer to form a first gate element having a first gate pattern; transferring the first gate pattern to the metal layer to form a second gate element; conformally forming a second protective layer on the exposed surfaces of the substrate, first gate elements element, and the second gate element and the conducting layer, causing a second gate pattern; and transferring the and second gate pattern to the conducting layer to form a third gate element.

According to another aspect of the present invention, in the method for manufacturing gate structure, wherein the side surface of the first protective layer is partially removed by less than 20%.

According to a further aspect of the present invention, the method for manufacturing gate structure further comprises a step of conformally forming an insulating layer on the first gate element and second gate element having the second protective layer and on the third gate element after transferring the second gate pattern to the conducting layer.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETIALED DESCRIPTION OF THE PREFERRED EMBODIMENT

An embodiment of the present invention will be described in detail with reference to the accompanying drawings.

Figure 2A:
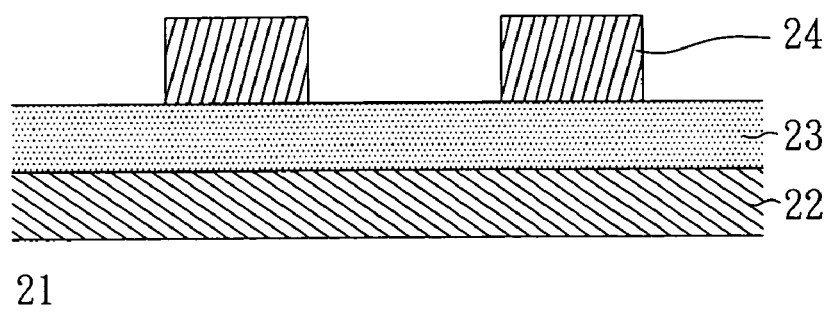
FIGS. 2a to 2g are schematic sectional drawings illustrating the respective steps of the method of an embodiment in accordance with the present invention.

In FIG. 2a, a conducting layer 22, preferably formed of poly-silicon, is formed on a substrate 21, preferably formed of silicon, by deposition or the like. A metal layer 23, preferably made of WSi, is formed on the conducting layer 22 by deposition or the like. A protective layer 24, preferably comprising SiN, is formed with a predetermined gate pattern on the metal layer 23 by deposition and etching. The protective layer 24 of the predetermined gate pattern has a plurality of protective elements, each of which has exposed top surface and side surface.

Figure 2B:
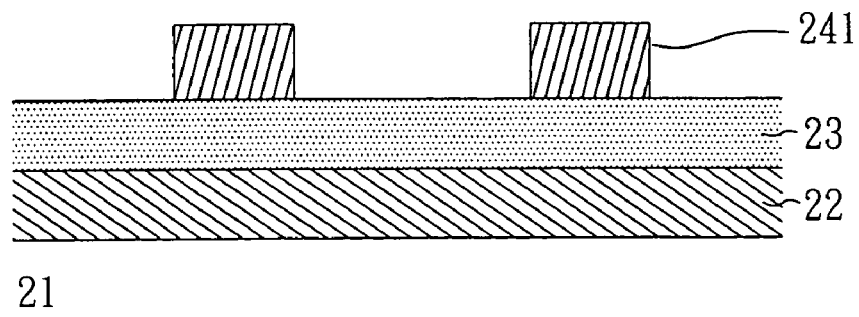

The top and the side of each protective element are partially removed by wet etching, for instance, to form a gate protective element 241, as shown in FIG. 2b. The removed proportion of the protective element is preferably less than 20% to minimize the influence on the gate electric performance.

Figure 2C:
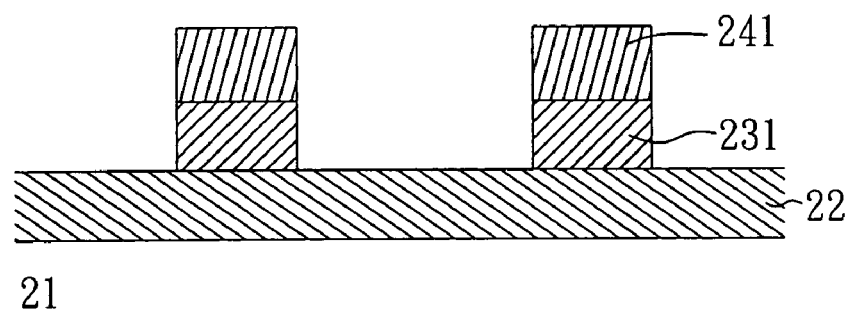

Then, as shown in FIG. 2c, the portions of the metal layer 23 not covered by the gate protective elements 241 are removed to form a plurality of gate metal elements 231, that is, the pattern of the gate protective elements 241 is transferred to the metal layer 23.

Figure 2D:
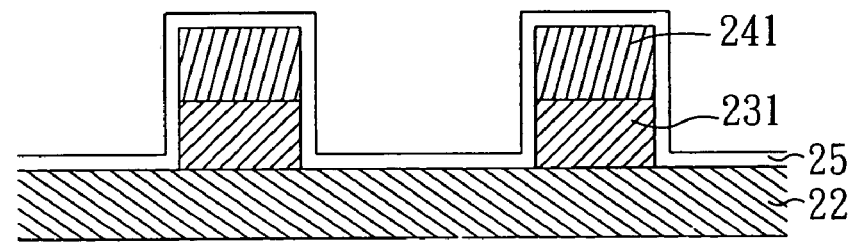

A thin protective layer 25 is preferably formed on the exposed surfaces of the substrate 21, gate protective elements 241 and gate metal elements 231 by deposition or the like, as shown in FIG. 2d. The protective layer 25 preferably comprises silicon nitride.

Figure 2E:
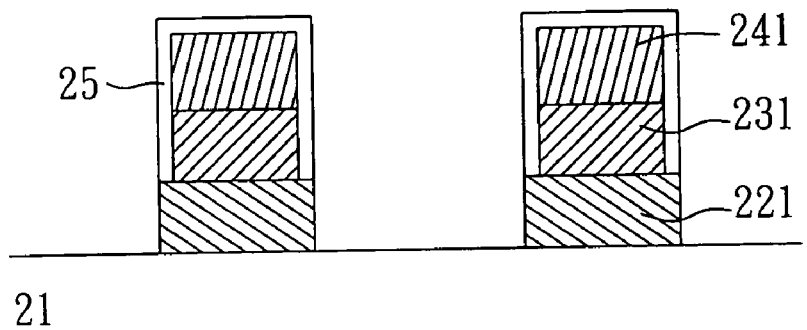

As shown in FIG. 2e, the portions of the conducting layer 22 not covered by the gate protective elements 241 and the gate metal elements 231 having the protective layer 25 are removed by etching or the like. That is, the pattern constructed by the gate metal elements 231 having the protective layer 25 is transferred to the conducting layer 22 to form gate conducting elements 221.

Figure 2F:
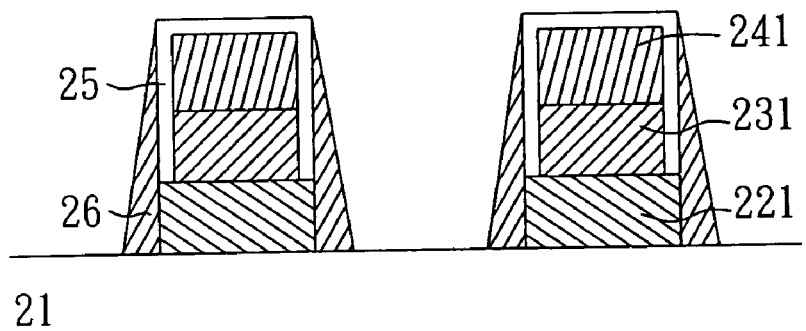

An insulating layer 26, which preferably comprises silicon nitride, is formed on the sides of the gate protective element 241 and the gate metal element 231 having the protective layer 25, and on the side of the gate conducting element 221 by deposition, for example, as shown in FIG. 2f.

Figure 2G:
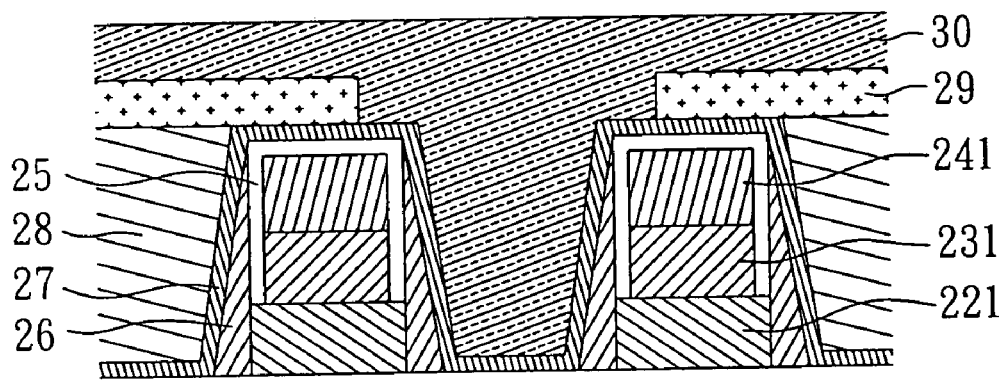

Subsequently, a barrier layer 27 generally comprising silicon nitride is formed on the surface of the whole structure by a general process. Then an insulating layer 28 generally comprising BPSG and an insulating layer 29 generally comprising TEOS are formed. A bit line contact hole is selectively formed in the insulating layers. A metal layer 30, which is referred to a M0 metal layer, is formed as a bit line and filled into the contact hole to form a bit line contact, as shown in FIG. 2g.

Figure 1:
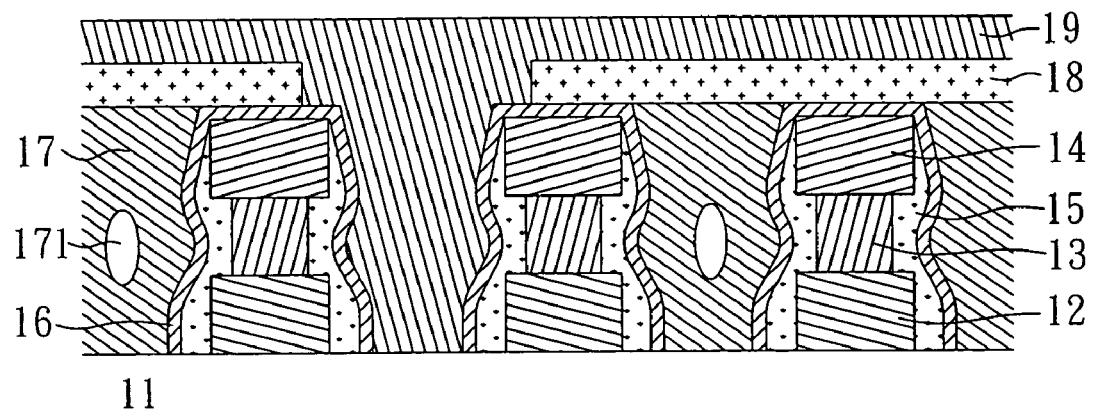
FIG. 1 is a schematic sectional diagram showing a bit line contact structure formed by the conventional DRAM semiconductor memory process.

As can be seen from the above embodiment, the gate structure formed according to the method of the present invention has the protective layer 25, in addition, the critical dimension of the gate metal element 231 is small. Accordingly, the improper short circuit between the bit line metal layer 30 and the gate metal element 231 can be avoided. Furthermore, the protective element 241 and gate metal element 231 having the protective layer 25 have the same critical dimension as the gate conducting element 221, thus, the generation of the voids 171 as shown in FIG. 1, due to the inward indenting metal layers 13, can be avoided. Therefore, the insulating property and the electrical performance of the whole structure can be well maintained.

While the embodiments of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for manufacturing a gate structure, said method comprising steps of:

providing a substrate;
   forming a conducting layer on the substrate;
   forming a metal layer on of the conductive layer;
   forming a patterned first protective layer on the metal layer, the protective layer having a side surface;
   partially removing the side surface of the first protective layer to form a first gate element having a first gate pattern;
   transferring the first gate pattern to the metal layer to form a second gate element;
   conformally forming a second protective layer on the first gate element, the second gate; element and the conducting layer, causing a second gate pattern; and
   transferring the second gate pattern to the conducting layer to form a third gate element.

2. The method as claimed in claim 1, wherein said substrate comprises silicon.

3. The method as claimed in claim 1, wherein said conducting layer comprises poly silicon.

4. The method as claimed in claim 1, wherein said metal layer comprises WSi.

5. The method as claimed in claim 1, wherein said first protective layer comprises silicon nitride.

6. The method as claimed in claim 1, wherein the side surface of said first protective layer is partially removed by less than 20%.

7. The method as claimed in claim 1, wherein said removing step is performed by wet etching.

8. The method as claimed in claim 1, wherein said second protective layer comprises silicon nitride.

9. The method as claimed in claim 1, further comprising a step of conformally forming an insulating layer on the first gate element and second gate element having the second protective layer and on the third gate element after the second gate pattern is transferred to the conducting layer.

10. The method as claimed in claim 9, wherein said insulating layer comprises silicon nitride.

* * * * *